(12) United States Patent
Lang et al.

(10) Patent No.: US 6,297,646 B1
(45) Date of Patent: *Oct. 2, 2001

(54) ELECTRICAL TESTER FOR SMALL MOTOR VEHICLES

(75) Inventors: Curt W. Lang, Cedarburg; Mark A. Glade, Kenosha, both of WI (US)

(73) Assignee: Snap-on Tools Company, Kenosha, WI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,628

(22) Filed: Jun. 25, 1998

Related U.S. Application Data

(60) Provisional application No. 60/050,742, filed on Jun. 25, 1997.

(51) Int. Cl.[7] .................................................. G01R 31/02
(52) U.S. Cl. ............................................. 324/556; 324/504
(58) Field of Search ........................... 324/503, 504, 324/508, 527, 537, 555, 556, 66, 73.1, 380; 340/635, 653, 654

(56) References Cited

U.S. PATENT DOCUMENTS

| | | | |
|---|---|---|---|
| 3,663,939 | 5/1972 | Gregorio | 324/537 |
| 3,935,427 | 1/1976 | Geul | 324/378 |
| 4,002,972 | 1/1977 | Konad et al. | 324/500 |
| 4,131,772 | * 12/1978 | Weckenmann et al. | 200/61.54 |
| 4,215,306 | 7/1980 | Mace | 324/555 |
| 4,866,390 | 9/1989 | Butchko | 324/504 |
| 4,870,347 | 9/1989 | Cicerone | 324/114 |
| 4,884,033 | * 11/1989 | McConchie, Sr. | 324/503 |
| 4,901,025 | 2/1990 | Hirano et al. | 324/537 |
| 5,086,277 | * 2/1992 | Hammerly | 324/504 |
| 5,095,276 | 3/1992 | Nepil | 324/504 |
| 5,129,259 | * 7/1992 | View et al. | 73/118.1 |
| 5,172,062 | 12/1992 | Eisermann | 324/503 |
| 5,177,447 | 1/1993 | Marino et al. | 324/503 |
| 5,192,912 | 3/1993 | Lemon | 324/504 |
| 5,214,582 | * 5/1993 | Gray | 701/33 |
| 5,280,251 | 1/1994 | Strangio | 324/133 |
| 5,315,252 | 5/1994 | Puetz et al. . | |
| 5,315,256 | 5/1994 | Schuyler | 324/511 |
| 5,329,238 | 7/1994 | Hofsass et al. . | |
| 5,337,013 | 8/1994 | Langer et al. . | |
| 5,359,290 | 10/1994 | Cervas . | |
| 5,428,294 | 6/1995 | Teel, Jr. | 324/556 |
| 5,446,389 | 8/1995 | Lenz . | |
| 5,530,360 | 6/1996 | Kerchaert et al. . | |
| 5,532,927 | * 7/1996 | Pink et al. | 701/34 |
| 5,602,482 | 2/1997 | Gutierrez . | |
| 5,635,843 | 6/1997 | Borland | 324/504 |
| 5,739,694 | 4/1998 | Grochulski | 324/556 |

* cited by examiner

*Primary Examiner*—Safet Metjahic
*Assistant Examiner*—Vincent Q. Nguyen
(74) *Attorney, Agent, or Firm*—Seyfarth Shaw

(57) ABSTRACT

A tester includes a housing containing a passive test circuit including a plurality of LEDs respectively connected to terminals of a multi-terminal connector jack on the housing for connecting the tester, by means of an associated cable harness, between a keyswitch module and other electronic circuits on an associated vehicle to be tested. Different harnesses may be provided, tailored to different vehicles. The test circuit is powered by a battery on board the vehicle and includes indicators dedicated to checking to see if the battery is connected properly and if an associated battery charging circuit on the vehicle is operating properly. The remaining indicators check different circuits, depending upon the particular vehicle being tested. The test circuit includes override switches associated with certain ones of the indicators and a test switch for simultaneously energizing all of the indicators. A relay shorts two of the jack terminals until the tester is powered, the cable harness including a diode across those terminals which is normally shorted out and is placed in circuit when the relay is energized.

3 Claims, 4 Drawing Sheets

ELECTRICAL TESTER FOR SMALL MOTOR VEHICLES

CROSS-REFERENCE TO RELATED APPLICATION

This application claims the benefit of U.S. provisional application Ser. No. 60/050,742, filed Jun. 25, 1997.

BACKGROUND OF THE INVENTION

The present invention relates generally to test and diagnosis equipment for testing electrical circuits of engine-powered vehicles, particularly vehicles powered by internal combustion engines. The invention has particular application to small engine-powered vehicles, including small lawn and garden vehicles, such as tractors, lawn mowers and the like.

Many small motor vehicles, such as, tractors, riding or push-type lawn mowers, or similar lawn and garden vehicles, are powered by internal combustion engines and are provided with on-board electrical circuits which control and monitor many operations of the engine and other aspects of the vehicle. Such on-board circuits may control such things as engine starting and ignition, lighting, displays and various safety interlocks. For example, in a typical tractor lawn mower there are "dead man" interlocks which prevent the engine from starting or the mower blade or the propulsion wheels of the vehicle from being engaged unless the operator is seated on the vehicle seat, with his foot on the brake. In this regard, such vehicles are typically provided with an ignition keyswitch similar to that in an automobile, which may have multiple positions, such as LOCK or OFF, ON and START. Such vehicles are also commonly provided with a number of indicators, such as indicator lights or the like, which are designed to be energized in various keyswitch positions, to indicate the condition of the vehicle to the operator. Thus, when the keyswitch is turned ON, various indicator lamps may light to indicate the condition of certain systems of the vehicle, and may indicate whether or not it is safe to start the vehicle.

Heretofore testing of the electrical circuits of such vehicles has been a time-consuming process. Typically, test equipment such as a voltmeter, ammeter or the like has been utilized to manually test the voltage or current condition at various points in the circuitry. It could, with certain vehicles, take up to 45 minutes to complete a test procedure necessary to isolate and identify a circuit fault.

SUMMARY OF THE INVENTION

It is a general object of the present invention to provide an improved test apparatus for testing the electrical circuits of small motor vehicles, which avoids the disadvantages of prior test techniques, while affording additional structural and operating advantages.

An important feature of the invention is the provision of a test apparatus which will rapidly test the electrical circuits of a motor vehicle.

In connection with the foregoing feature, another feature is the provision of a test apparatus of the type set forth, which is simple to operate and is of relatively simple and economical construction.

Still another feature of the invention is the provision of a test apparatus of the type set forth, which is readily adaptable to use with any of a wide variety of small motor vehicles made by various manufacturers.

In connection with the foregoing feature, another feature of the invention is the provision of a test apparatus of the type set forth, which includes an interconnect cable assembly adaptable for coupling to the vehicle under test, and which can be customized to specific vehicles.

Yet another feature of the invention is the provision of a test apparatus of the type set forth, which includes certain self-test features, as well as certain override features which will allow certain circuits to be bypassed.

In connection with the foregoing feature, another feature of the invention is the provision of override circuitry which will prevent the overriding of mandatory safety interlocks.

The invention consists of certain novel features and a combination of parts hereinafter fully described, illustrated in the accompanying drawings, it being understood that various changes in the details may be made without departing from the spirit, or sacrificing any of the advantages of the present invention.

BRIEF DESCRIPTION OF THE DRAWINGS

For the purpose of facilitating an understanding of the invention, there are illustrated in the accompanying drawings preferred embodiments thereof, from an inspection of which, when considered in connection with the following description, the invention, its construction and operation, and many of its advantages should be readily understood and appreciated.

DESCRIPTION OF THE PREFERRED EMBODIMENTS

Figure 2:
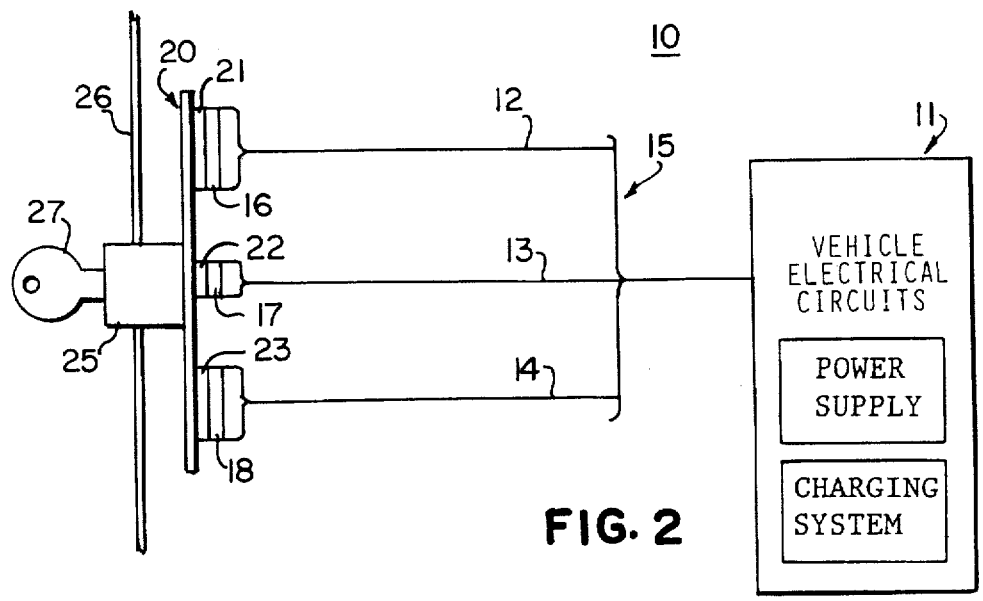
FIG. 2 is a functional block diagram of certain control elements of a small motor vehicle of the type with which the tester of FIG. 1 is intended to be used.

Referring to the drawings, FIG. 2 diagrammatically illustrates relevant portions of a small motor vehicle 10, such as a tractor, mower, or the like, of the type with which the present invention is intended to be used. Typically, the vehicle 10 will have an internal combustion engine (not shown) and will be provided with chassis wheels (not shown), which may be powered by the engine, and with associated power takeoff (PTO) devices, such as mower blades or the like (not shown), which are also powered by the engine, all in a known manner. The vehicle 10 will have a plurality of electrical circuits, collectively designated 11, which will typically include a battery, such as a 12-VDC battery, which may power certain components of the vehicle, such as head lamps, indicator lights and the like, and will also be used to power the ignition system of the internal combustion engine, all in a known manner. If the vehicle motor is designed to be electrically started, it will also be provided with a suitable starter (not shown) which is also powered by the battery, and there will typically be provided an alternator or generator (not shown) for charging the battery.

The electrical circuits 11 are typically adapted to be connected to a keyswitch circuit board or module 20 by means of a cable harness 15, which includes a plurality of cables, such as cables 12, 13 and 14. In the illustrated embodiment, the cables 12–14 are, respectively, provided with jacks 16, 17 and 18 which, in turn, are coupled to plugs 21, 22 and 23 on the keyswitch board 20. Also mounted on the keyswitch board 20 is a keyswitch 25, supported in a complementary opening in a wall or panel 26 of the vehicle 10 and adapted to be operated with a key 27, all in a known manner. Typically, the vehicle battery is disconnected from the rest of the electrical circuits 11 until the keyswitch 25 is turned to an ON position by use of the key 27.

Referring to FIGS. 1 and 3–5, there is illustrated test apparatus including an analyzer or tester, generally designated by a numeral 30, and an interconnect cable harness 60, constructed in accordance with a first embodiment of the present invention, for analyzing electrical circuits 11 of a motor vehicle, such as the vehicle 10. In particular, the tester 30 is adapted to identify defective circuits or components in the vehicle 10 by monitoring the signal levels at such circuits or components, to assist in diagnosis and repair. The tester 30 is provided with a housing 31 (FIG. 1) having a front user interface panel 31A provided with a plurality of pushbuttons 32–36 for respectively operating a TEST switch and override switches S1–S4, as will be explained more fully below. Also mounted on the front panel 31A of the housing 31 are 24 LEDs 37, which are preferably respectively numbered with adjacent indicia 38. A multi-terminal jack 39, such as a 24-pin jack, is mounted on the housing 31.

Figure 4:
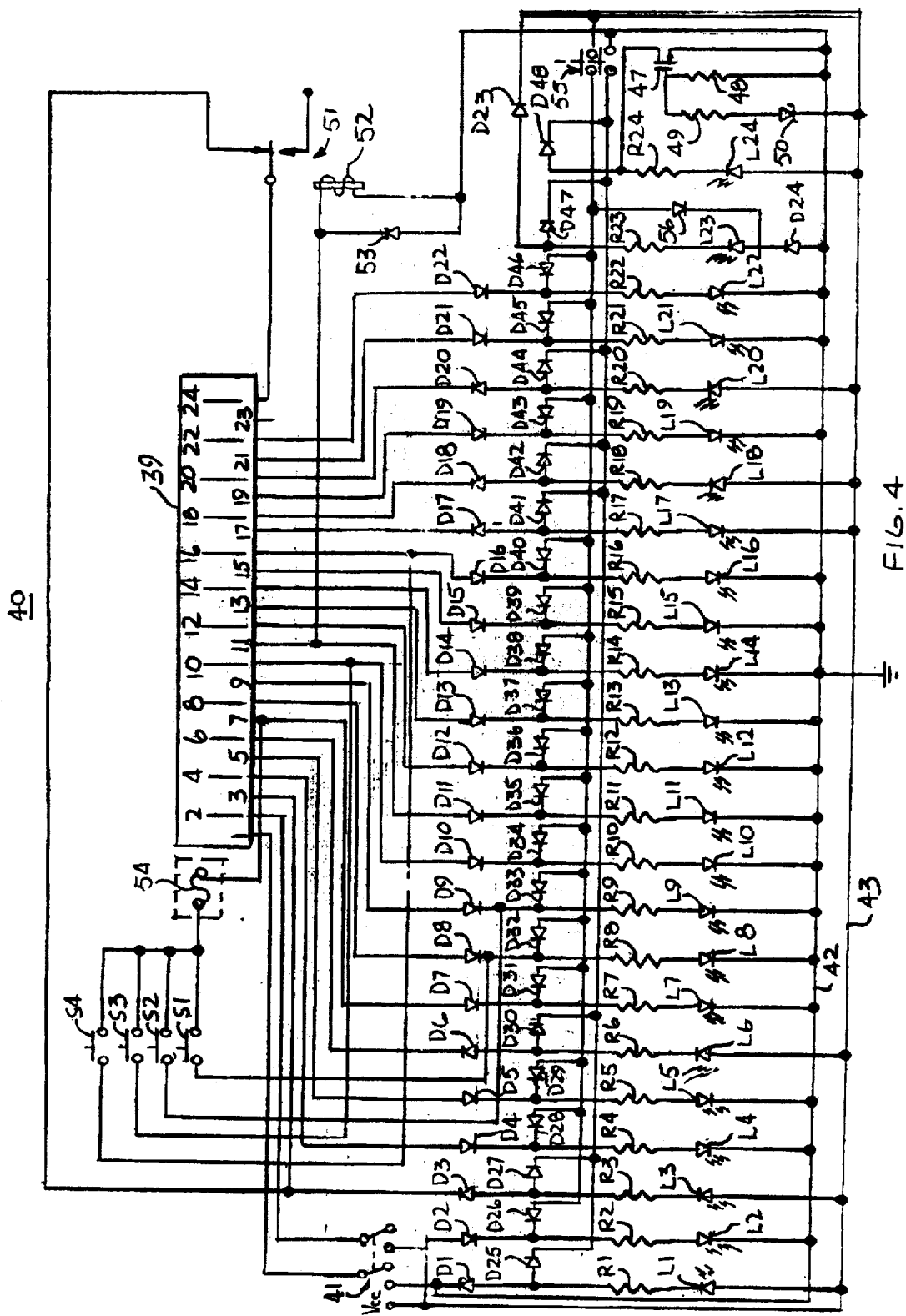
FIG. 4 is a schematic diagram of the circuitry of the tester of FIG. 1.

Referring to FIG. 4, there is illustrated an electronic circuit 40 which is disposed within the housing 31 of the tester 30 and is preferably mounted on a printed circuit board. The circuit 40 includes the 24-pin connector jack 39, preferably disposed in a recessed, user-accessible socket at one end of housing 31. Pins 1–22 of the jack 39 are, respectively, connected to the correspondingly-numbered LEDs 37, which are respectively designated L1 through L22 in FIG. 4. LEDs L23 and L24 are not connected to pins 23 and 24 and will be described more fully below. Additionally, pins 1 and 2 of the jack 39 are respectively connected, through the two poles of an optional double-pole, single-throw ON-OFF switch 41, to a ground line 42 and a VCC power line 43. Pins 1 and 2 of jack 39 are dedicated for connection, respectively, to the ground and positive terminals of the vehicle battery, so that +12 VDC typically appears on pin 2 when the tester 30 is connected to a vehicle 10, as described below. The LEDs L1–L24, are all connected in parallel across the ground and power lines 42 and 43, and are, respectively, in series with current-limiting resistors R1–R24, the LEDs L1–L23 also respectively being in series with blocking diodes D1–D23, but some of the LEDs, e.g., L1, L3, L6, etc., have their cathodes connected to the jack 39, while others, e.g., L2, L4, L5, etc., have their anodes connected to jack 39. These arrangements are for detecting both positive and negative voltages, and the number of LEDs connected in each arrangement is determined based upon the anticipated number of circuits in known motor vehicles which will provide each polarity of voltage.

LED L23 is dedicated to a battery reversal test and is not connected to pin 23 of jack 39. Rather, it is connected in series with diodes D23 and D24 across the ground and power lines 42 and 43, with the diode anodes connected to the ground line 42, so that the LED L23 will light if the battery is hooked up backwards.

LED L24 is dedicated to a test of the vehicle's battery charging system. The cathode of the LED L24 is connected through the current-limiting resistor R24 to the drain of an FET 47, the source of which is connected to ground. The base of the transistor 47 is connected through a resistor 48 to ground and through a resistor 49 to the anode of an 11-volt Zener diode 50, the cathode of which is connected to the power line 43. When the voltage in the power line 43 rises to just above 12 volts, the Zener diode 50 will start conducting and will turn on the transistor 47 for lighting the LED L24 to indicate that the battery charging circuit is operating properly.

If the vehicle 10 has a magneto kill switch, the pin 3 of jack 39 must be connected to that circuit for testing the magneto kill switch. Pin 3 is connected to one of the fixed switch contacts of a relay 51 which, in the normal deenergized condition of the relay, is connected through the movable contact to pin 24 of jack 39. The relay coil 52 is connected in parallel with an induction surge diode 53 between pin 11 of jack 39 and the ground line 42. When the vehicle keyswitch 25 is turned ON, +12 VDC appears on pin 11 to energize the relay coil 52 and switch the relay to remove the short between pins 3 and 24, for a purpose to be explained more fully below.

Figure 1:
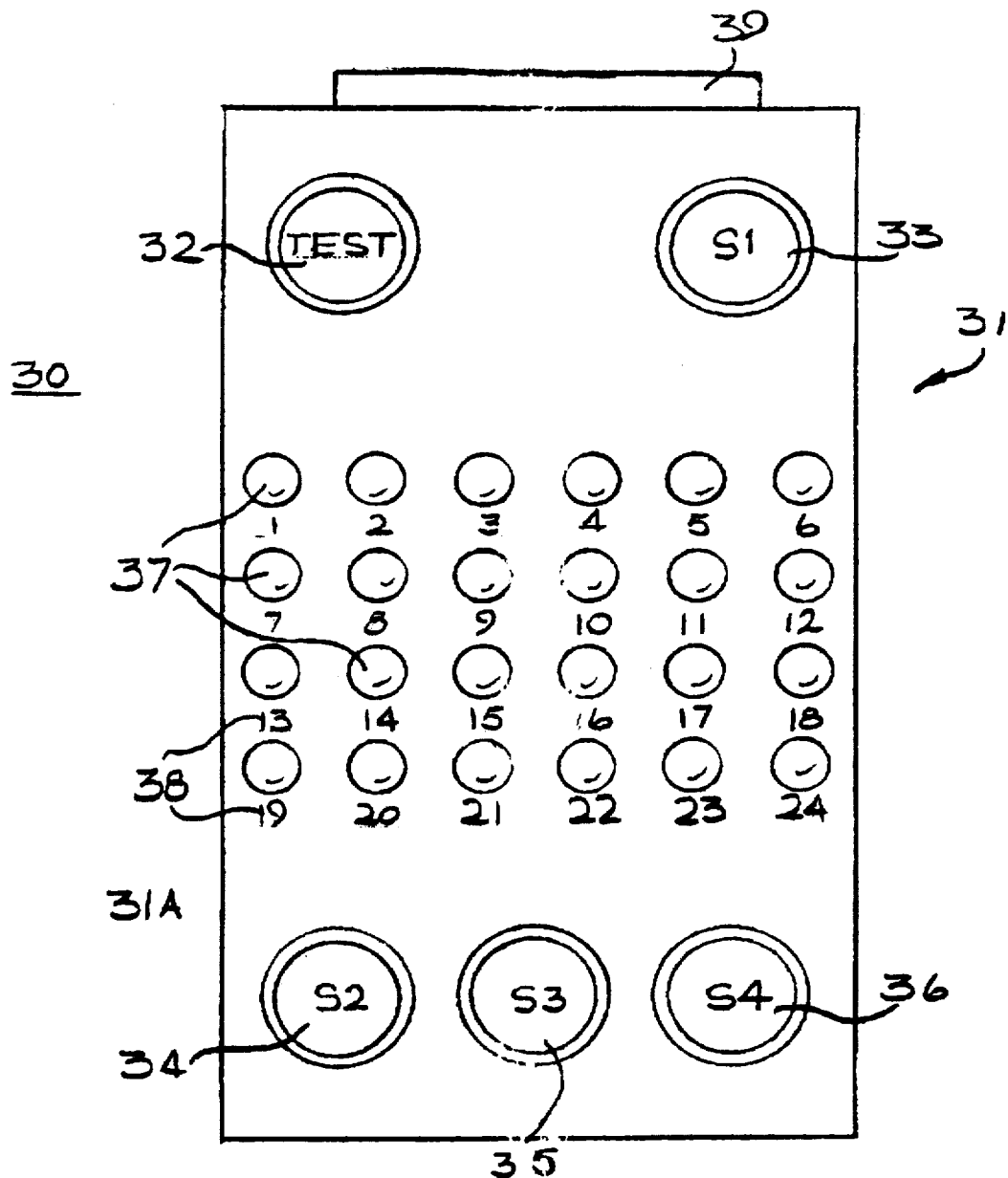
FIG. 1 is a top plan view of the user interface panel of the housing of a tester constructed in accordance with and embodying the features of the present invention.

The tester 30 is provided with four override switches S1–S4, respectively operated by the pushbuttons 33–36 (FIG. 1). These override switches are connected through a fuse 54 to pin 7 of jack 39, which pin must be connected to the switched power of the vehicle 10. Switch S4 shorts pin 7 to pin 16, while switch S3 shorts pin 7 to pin 10. Switches S1 and S2 are, respectively, connected to pins 8 and 9 of jack 39 through diodes D8 and D9. Pins 8 and 9 must, respectively, be connected to the neutral start and PTO reset circuits of the vehicle 10, and the diodes D8 and D9 prevent starting of the engine or operation of the power takeoff when the override switches S1 or S2 are closed.

There is also provided a TEST switch 55 operated by the pushbutton 32 (FIG. 1) which, when closed, will energize all of the LEDs L1–L24 to see if they are operating properly. The TEST switch 55 is a double-pole switch, the two poles respectively connecting the ground line 42 and the power line 43 to the LEDs L1–L24 through blocking diodes D25–D48, and also connecting power line 43 to the anode of the battery reversal LED 23 though a diode 56.

Figure 3:
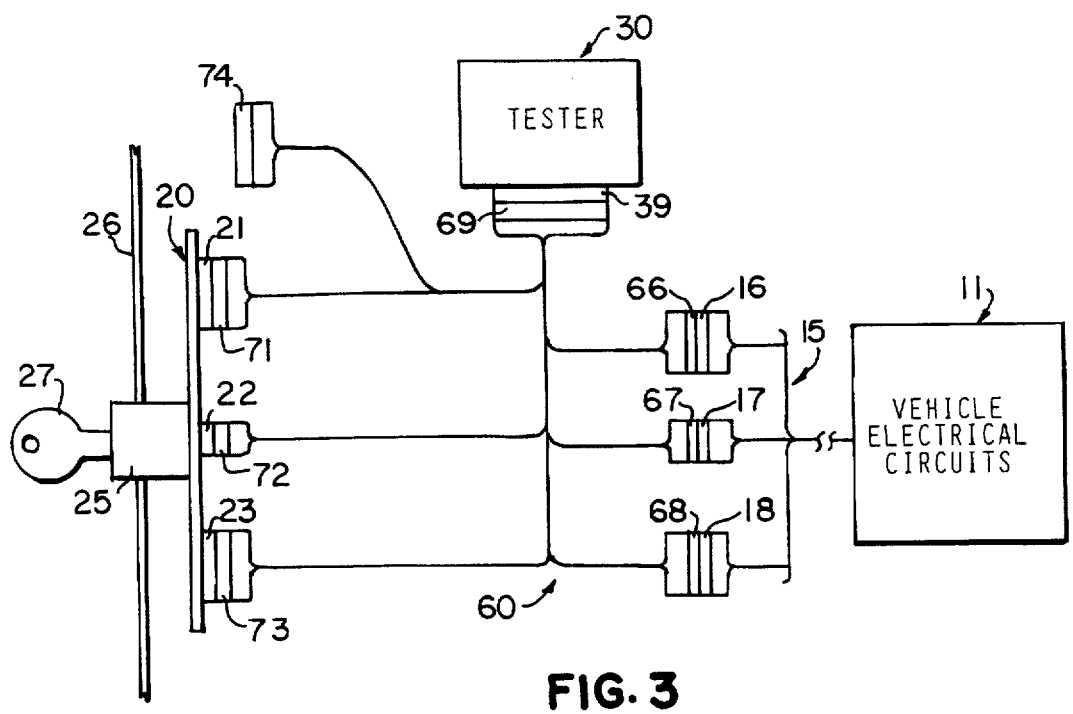
FIG. 3 is a view similar to FIG. 2, illustrating the connection of the tester of FIG. 1 to the vehicle by an interconnect cable harness in accordance with the invention.
Figure 5:
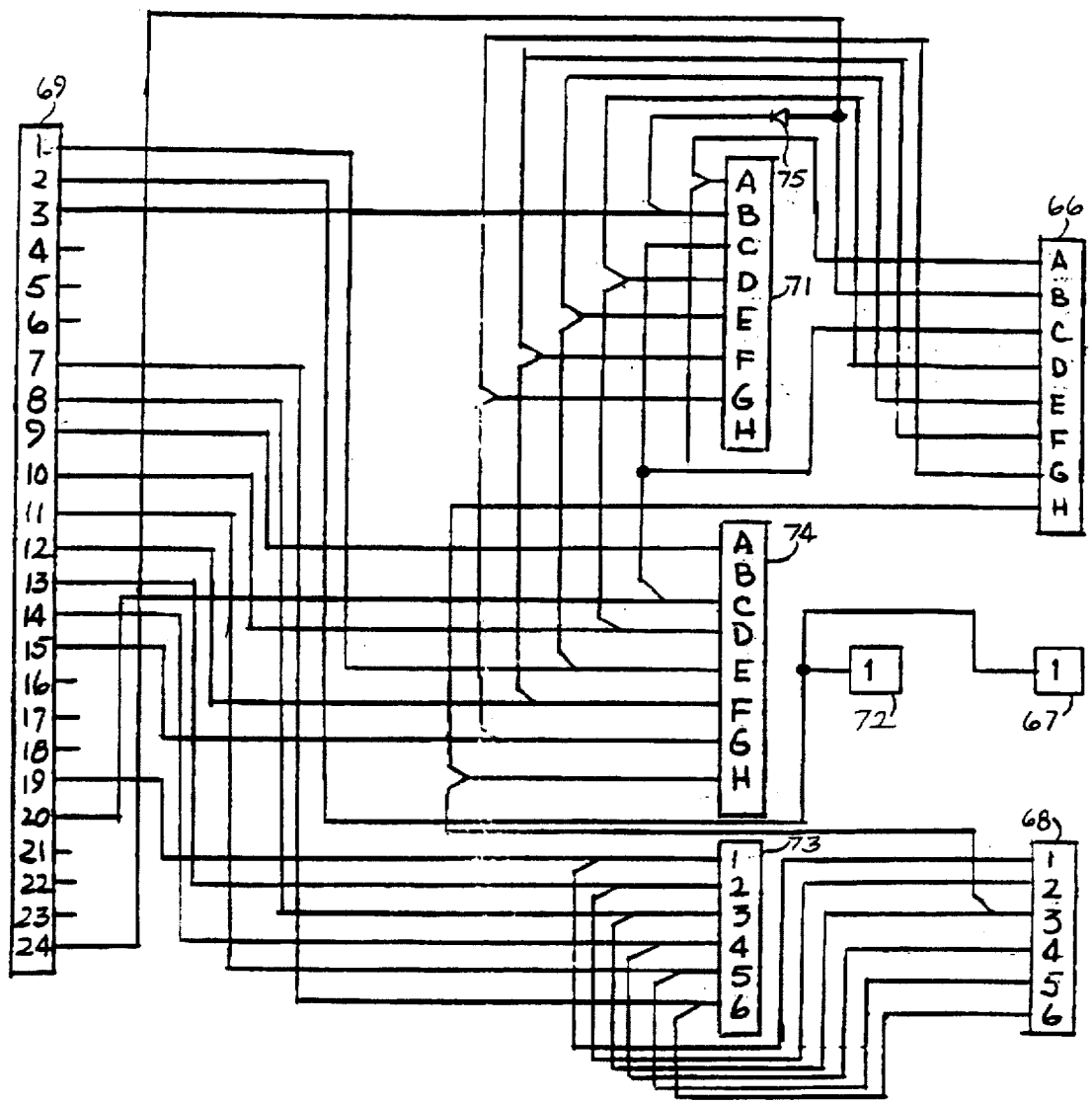
FIG. 5 is a schematic circuit diagram of the interconnect cable harness of FIG. 3.

Referring now in particular to FIGS. 3 and 5, the test apparatus of the present invention includes an interconnect cable harness 60 for connecting the tester 30 in series between the keyswitch board or module 20 and the cable harness 15 of the vehicle 10. Thus, the interconnect cable harness 60 has a 24-pin plug 69 adapted to be plugged into the jack 39 of the tester 30, plugs 66, 67 and 68, adapted to be respectively plugged into the jacks 16–18 of the vehicle cable harness 15, and jacks 71, 72, 73 and 74, adapted to be connected to the plugs of the keyswitch board 20. In this regard, jacks 72 and 73, respectively, connect to the plugs 22 and 23, while jacks 71 and 74 are both adapted for connecting to the plug 21, these two alternative jacks being provided to accommodate different keyswitch boards which have different versions of plug 21. Thus, it will be appreciated that, when the test apparatus of the present invention is intended to be used, the operator disconnects the vehicle's wiring harness 15 from the keyswitch board 20, and then connects the interconnect cable harness 60 to the tester 30 and between the vehicle cable harness 15 and keyswitch 20, in the manner illustrated in FIG. 3.

Referring to FIG. 5, a diode 75 has its cathode connected to pin 3 of plug 69 and pin B of jack 71, and its anode connected to pin 24 of plug 69 and pin B of plug 66. The diode 75 is connected in circuit with the magneto kill switch so that the tester will see ground to light LED L3 only if the magneto kill is operating properly. The relay K1 (FIG. 4)

shorts the diode 75 out of the circuit when the keyswitch 25 is OFF, so the engine can be killed, and is operated to remove the short and place the diode 75 back in circuit when the keyswitch 25 is in the ON position.

As was indicated above, the ON-OFF switch 41 is optional. Alternatively, the pins 1 and 2 of jack 39 may, respectively, be directly hard wired to lines 42 and 43. If the switch 41 is used, it is typically a toggle switch which is mounted on the user interface panel 31A of the housing 31 (not shown in FIG. 1).

In using the test apparatus of the present invention with a vehicle having a "green board" keyswitch module 20 (usable with the jack 71 of the interconnect cable harness 60), such as certain vehicles made by John Deere, the operator will connect the tester 30 in accordance with the following procedure:

Green Board Keyswitch Test Procedure

1. Ensure key switch is in the OFF position. Turn on the power switch of the tester. L1, L2 and L3 should light. If not, refer to the troubleshooting guide.
2. Ensure PTO switch is off, brake is on, and seat switch is on. Turn keyswitch to the ON position. L7–L13 should light. L1 and L2 should remain lit. L3 should extinguish. If not, refer to the troubleshooting guide.
3. Ensure PTO switch is off, brake is on, and seat switch is on. Turn keyswitch to the start position. L19 should light all other LED's should remain the same. If not, refer to the troubleshooting guide.
4. If steps 1–3 pass, wiring harness and keyswitch module should be considered good.

End of Test

In this test procedure, the various LEDs are connected to vehicle circuits, and their illumination or lack of illumination signifies faults in accordance with the following troubleshooting guide, wherein the designations "POS-OFF" and "POS-ON" indicate keyswitch positions and connector designations are those used by the vehicle manufacturer:

Green Board Keyswitch Troubleshooting Guide

| L1 = Ground | L10 = Seat Switch |
| L2 = Battery | L11 = Headlights |
| L3 = Magneto Kill | L12 = Ignition Coil |
| L7 = Switched Power | L13 = PTO Output |
| L8 = Neutral Start | L19 = Start Out |
| L9 = PTO Reset | L20 = Coolant Bulb |

Pos - Off, L1 and L2 Will Not Light

1. L1 represents ground coming in the wiring harness at jack 71, pin E; L2 represents the battery voltage (12V) coming in the wiring harness at jack 72.
2. L1 and L2 do not light because: the battery fuse is blown; there is an open between the battery positive and jack 72; there is an open between battery ground and jack 71, pin E; or the battery voltage is low.

Pos—Off, L3 Will Not Light

1. L3 represents magneto kill coming from the keyswitch module at jack 71, pin B.
2. L3 does not light because the keyswitch is bad or there is an open on the keyswitch module.

Pos—On, L7 Will Not Light

1. L7 represents switched power coming out of the keyswitch module at jack 73, pin G.
2. L7 does not light because: keyswitch fuse on vehicle is open; the keyswitch is bad; or there is an open foil on the keyswitch module.

Pos—On, L8 Will Not Light

1. L8 represents neutral start coming in the wiring harness at jack 73, pin 3.
2. L8 does not light because: PTO switch is not off or is bad; brake switch is not on or is bad; or an open wire in the wiring harness.
3. Pressing S1 will override switches and wiring harness associated with neutral start.

Pos—On, L9 Will Not Light

1. L9 represents PTO reset coming from the wiring harness at jack 71, pin A.
2. L9 does not light because: PTO switch is on or bad or a bad wire in the wiring harness.
3. Pressing S2 will override switches and wiring harness associated with PTO reset.

Pos—On, L10 Will Not Light

1. L10 represents the seat switch coming from the. wiring harness at jack 71, pin D.
2. L10 does not light because: the seat switch is not on or a bad wire in the wiring harness.
3. Pressing S3 will override switches and wiring harness associated with the seat switch.

Pos—On, L11 Will Not Light

1. L11 represents the head lights coming from the keyswitch module at jack 73, pin 5.
2. L11 does not light because: headlight fuse on vehicle is blown; the ignition switch is bad; or an open foil on the keyswitch module.

Pos—On, L12 Will Not Light

1. L12 represents the ignition coil coming from the keyswitch module at jack 71, pin F.
2. L12 does not light because: L8 or L10 is not lit (if so, return to L8 or L10 step and troubleshoot from there); ignition relay on vehicle is bad; or there is an open on the keyswitch module.

Pos—On, L13 Will Not Light

1. L13 represents the PTO output coming from the keyswitch module at jack 73, pin 2.
2. L13 does not light because L9 or L12 is not lit (if so, return to L9 or L12 step and trouble shoot from there); PTO relay on vehicle is bad; or there is an open on the keyswitch module.

Pos—Start, L19 Will Not Light

1. L19 represents the start out coming from the keyswitch module at jack 73, pin 1.
2. L19 does not light because: start out relay on vehicle is bad; the keyswitch is bad; diode on vehicle is bad; or there is an open on the keyswitch module.

Pos—Start, L20 Will Not Light

1. L20 represents the coolant bulb coming from the keyswitch module at jack 71, pin C.
2. L20 does not light because: diode on vehicle is bad; the keyswitch is bad; or there is an open on the keyswitch module.

Similarly, when the blue keyswitch board 20 is utilized (coupled to jack 74 of the interconnect cable harness 60), the test procedure and troubleshooting guide are as follows:

Blue Board Keyswitch Test Procedure

1. Ensure key switch is in the OFF position, turn on the power switch of the tester. L1 and L2 should light. If not, refer to the troubleshooting guide.

2. Ensure PTO switch is off, brake is on, and seat switch is on. Turn keyswitch to the ON position. L7–L13 should light; L1 and L2 should remain lit. If not, refer to the troubleshooting guide.
3. Ensure PTO switch is off. Brake is on, and seat switch is on. Turn keyswitch to the START position. L19 and L20 should light all other LED's should remain the same. If not, refer to the troubleshooting guide.
4. While engine is running at a speed above idle L24 (charging LED) should be lit. At idle L24 should be off or dimly lit.
5. If steps 1–4 pass, wiring harness, keyswitch module and charging system should be considered good.

End of Test

Blue Board Keyswitch Troubleshooting Guide

| | |
|---|---|
| L1 = Ground | L12 = Headlights |
| L2 = Battery | L13 = PTO Output |
| L7 = Switched Power | L19 = Start Out |
| L8 = Neutral Start | L20 = Coolant Bulb |
| L9 = PTO Reset | L23 = Reverse Power |
| L10 = Seat Switch | L24 = Charging LED |
| L11 = Ignition Coil | |

All Positions, Only L23 Lit

1. L23 represents the polarity of the power coming into the keyswitch module.
2. L23 will light if the battery cables are reversed.

Pos—Off, L1 and L2 Will Not Light

1. L1 represents ground coming in the wiring harness at jack 74, pin E. L1 represents the battery voltage (12V) coming in the wiring harness at jack 72.
2. L1 and L2 do not light because: the battery fuse is blown; there is an open between the battery positive and jack 72; there is an open between battery ground and jack 74, pin E; or the battery voltage is low.

Pos—On, L7 Will Not Light

1. L7 represents switched power coming out of the keyswitch module at jack 73 pin 6.
2. L7 does not light because: keyswitch fuse on vehicle is open; the keyswitch is bad; or there is an open foil on the keyswitch module.

Pos—On, L8 Will Not Light

1. L8 represents neutral start coming in the wiring harness at jack 73, pin 3.
2. L8 does not light because: PTO switch is not off or is bad; brake switch is not on or is bad; or an open wire is the wiring harness.
3. Pressing S1 will override switches and wiring harness associated with neutral start.

Pos—On, L9 Will Not Light

1. L9 represents PTO reset coming from the wiring harness at connector jack 74, pin A.
2. L9 does not light because: PTO switch is on or bad or a bad wire in the wiring harness.
3. Pressing S2 will override switches and wiring harness associated with PTO reset.

Pos—On, L10 Will Not Light

1. L10 represents the seat switch coming from the wiring harness at jack 74, pin D.
2. L10 does not light because: the seat switch is not on or a bad wire in the wiring harness.
3. Pressing S3 will override switches and wiring harness associated with the seat switch.

Pos—On, L11 Will Not Light

1. L11 represents the ignition coil coming from the keyswitch module at jack 73, pin 5.
2. L11 does not light because: L8 or L10 is not lit (if so, return to L8 or L10 and troubleshoot from there); ignition relay on vehicle is bad; or there is an open on the keyswitch module.

Pos—On, L12 Will Not Light

1. L12 represents the headlights coming from the keyswitch module at jack 74, pin F.
2. L12 does not light because: headlight fuse on vehicle is blown; the ignition switch is bad; or and open foil on the keyswitch module Pos—On, L13 Will Not Light 1. L13 represents the PTO output coming from the keyswitch module at pack 73, pin 2.
2. L13 does not light because: L9 or L12 is not lit (if so, return to L9 or L12 an troubleshoot from there); PTO relay on vehicle is bad; or there is an open on the keyswitch module.

Pos—Start, L19 Will Not Light

1. L19 represents the start out coming from the keyswitch module at jack 73, pin 1.
2. L19 does not light because: start out relay on vehicle is bad; the keyswitch is bad; D5 is bad; or there is an open on the keyswitch module.

Pos—Start, L20 Will Not Light

1. L20 represents the coolant bulb output coming from the keyswitch at jack 74, pin C.
2. L20 does not light because: diode on vehicle is bad; the keyswitch is bad; or there is an open on the keyswitch module.

Pos—On, Engine Running at Above Idle, L24 Will Not Light

1. L24 represents the charging voltage coming from the charging system. This LED monitors the 12 VDC at plug 68, pin B. If this voltage is above 12.8 VDC the LED will light.
2. L24 does not light because: the tractor is at an idle speed or the charging system is bad.

When the tester 30 is to be used with a different vehicle, such as a vehicle made by a different manufacturer, a different interconnect cable harness 60 will be used. Thus, there may be provided a number of different interconnect cable harnesses 60, such as cable harnesses 60A and 60B (FIG. 3), respectively tailored to particular vehicles or types of vehicles.

From the foregoing, it can be seen that there has been provided an improved tester for the electrical systems of small motor vehicles, which can operate as a breakout box, easily interposed between the keyswitch and the wiring harness connected thereto by means of one of a number of interconnect cable harnesses respectively customized for specific vehicles, the tester having certain indicators dedicated to specific tests, the tester providing switches for overriding certain tested circuits and preventing overriding of mandatory safety interlocks, and including provision for self-test of the indicators.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A portable apparatus for passively testing without selectively controlling any of a plurality of different types of electronic circuits, including a power supply circuit with a switch producing a switched supply output, normally connected to a keyswitch board on a small self-propelled lawn and garden vehicle, said apparatus comprising:

a housing, a connector jack on the housing having a plurality of terminals, a test circuit in the housing including an array of indicators connected across selected ones of the terminals for providing indications externally of the housing, said test circuit including a plurality of override switches for directly energizing a predetermined indicator and bypassing the associated portion of the connected electronic circuit, and a cable harness for connecting said jack to the keyswitch board and to selected ones of the electronic circuits including the power supply circuit for supplying signals to said test circuit from the connected electronic circuits so that said indicators indicate the conditions of said signals, one of the terminals of the connector jack being connectable to the switched supply output, at least one of the override switches being connected between an indicator and the one terminal for directly powering the indicator and confirming that the associated portion oft he connected electronic circuit is faulty.

2. The apparatus of claim 1, wherein at least one of the override switches is connected between the switched power supply output terminal and an indicator and is connected to the terminal associated with the indicator through a reverse-poled diode.

3. The apparatus of claim 1, wherein the test circuit includes a relay having a first condition providing a short between two of the terminals so as to disable indicators connected to those terminals, and a second condition removing the short.

* * * * *